United States Patent [19]
Brotherton et al.

[11] Patent Number: 6,108,204
[45] Date of Patent: *Aug. 22, 2000

[54] CPU HEAT SINK

[75] Inventors: Daniel Brotherton, Portland; Fred J. Shipley, Forest Grove; Syed Haider, Oregon City, all of Oreg.

[73] Assignee: Intel Corporation, Santa Clara, Calif.

[ * ] Notice: This patent issued on a continued prosecution application filed under 37 CFR 1.53(d), and is subject to the twenty year patent term provisions of 35 U.S.C. 154(a)(2).

[21] Appl. No.: 08/584,249

[22] Filed: Jan. 8, 1996

[51] Int. Cl.$^7$ ........................................................ H05H 7/22
[52] U.S. Cl. ............................ 361/704; 257/722; 361/690
[58] Field of Search ............................. 257/722; 361/690, 361/694–697, 704, 707, 715, 717–718, 725, 752

[56] References Cited

U.S. PATENT DOCUMENTS

| | | | |
|---|---|---|---|
| 4,360,141 | 11/1982 | Kensrue | 165/47 |
| 5,285,347 | 2/1994 | Fox et al. | 361/695 |
| 5,371,404 | 12/1994 | Juskey et al. | 361/690 |
| 5,398,161 | 3/1995 | Roy | 361/695 |
| 5,424,913 | 6/1995 | Swindler | 361/690 |
| 5,430,609 | 7/1995 | Kikinis | 361/687 |

FOREIGN PATENT DOCUMENTS

| | | | |
|---|---|---|---|
| 2133996 | 5/1990 | Japan | 361/690 |
| 4209598 | 7/1992 | Japan | 361/695 |

*Primary Examiner*—Gregory Thompson
*Attorney, Agent, or Firm*—Blakely, Sokoloff, Taylor & Zafman, LLP

[57] ABSTRACT

A cooling system for a multi processor system mounted in a rack that has a top, a bottom, sides and a plurality of card cages. Each of the card cages has card guides for receiving mother boards such that the mother boards are positioned vertically within the rack. A CPU is mounted on a mother board and a heat sink is mounted on top of the CPU and fastened to the mother board. The heat sink includes a plurality of air passages and is positioned with respect to the mother board such that when the mother board is mounted in the rack, the air passages are vertical. A blower is integrated into the rack such that air flows vertically through the rack. Also a heat sink for use on a baby AT mother board on which a CPU socket is mounted and into which a CPU is plugged. The baby AT mother board further includes a plurality of sockets for expansion boards to be mounted such that the expansion boards when plugged into the expansion board sockets are substantially perpendicular to the baby AT mother board a specified height above the baby AT mother board. Some number of expansion boards extend above the top surface of the CPU. The heat sink is a heat conductive body having fins and is mounted on the top surface of the CPU and extends beyond the top surface area of the CPU. But, the heat sink in combination with the CPU socket and the "PENTIUM" CPU are less in height than the specified height that the expansion board is above the baby AT mother board.

4 Claims, 8 Drawing Sheets

CPU HEAT SINK

BACKGROUND OF THE INVENTION

1. Field of The Invention

The present invention relates to heat sinks for central processing units ("CPU"). More particularly, it relates to heat sinks for "PENTIUM" CPUs used with baby AT mother boards.

2. Description of the Prior Art

As the circuitry for personal computers became more integrated, the majority of the components came to be located on a single printed circuit board—most often referred to as a mother board. A typical mother board provides the primary interconnections for the CPU and its support circuits, the memory—both RAM and ROM—the I/O interface and the system bus or busses.

The mother board typically occupies most if not all of the bottom of the computer's case. All of the other components of the computer occupy the space above the mother board. At the front of the case are the disk drives, which are the only mechanical components in the system. These devices use more power than most other components and therefore connect directly to the power supply. Various peripherals and peripheral expansion bays occupy some of the space above the mother board. The remaining space is reserved for expansion boards. The remaining space is reserved for expansion boards.

While the majority of a computer's components are attached directly to the mother board, there are many occasions in which it is desirable to connect other devices to the mother board. To accommodate this need, most modern mother boards have connectors mounted on the mother board into which expansion boards may be plugged. The connectors are connected to the bus on the mother board. Expansion boards are positioned perpendicular to the mother board. Expansion boards attached to computers in this way are housed in a rigid mechanical structure called a card cage which mechanically stabilizes the expansion board and helps to provide air circulation to keep the electrical components cool.

One of the characteristics of the personal computer industry is that it involves a vast number of independent suppliers of system components. In order for this industry organization to work effectively, rigorous standards must be established for how the components of the system will interface with each other. This applies to mother boards and all of the components that plug into the mother board. Its size and layout are specified.

Figure 1:
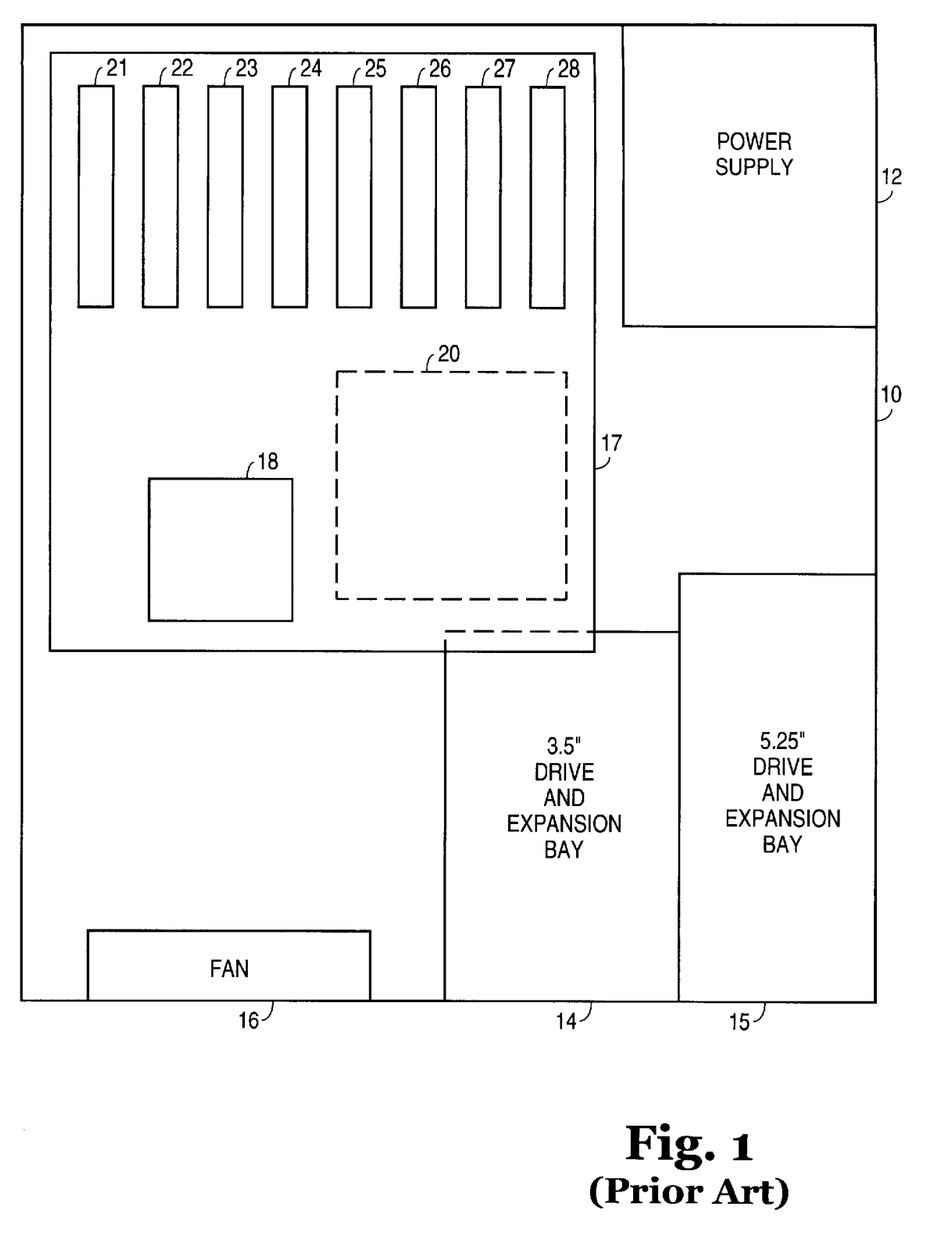
FIG. 1 is a schematic layout of a baby AT mother board.

Currently one of the most extensively used mother boards is referred to as the baby AT mother board. A typical personal computer chassis showing the location of a baby AT mother board is set out in FIG. 1. Referring now to FIG. 1, a bottom member 10 of a typical personal computer chassis has located thereon a power supply 12 as well as spaces 14 and 15 for various disk drives and disk drive expansion space. There is also a fan, not shown, for supplying a flow of air across the various components to keep them below a specified temperature. A mother board 17 is attached to bottom member 10 A CPU assembly 18 is mechanically and electrically attached to mother board 17. CPU assembly 18 typically consists of a socket mounted to mother board 17, a packaged CPU chip inserted into the socket and in some cases a heat sink mounted on top of the packaged CPU chip. Additional mother board components such as memory and CPU support chips are located in area 20. Expansion board connectors 21 through 28 are also mechanically and electrically connected to mother board 17. Significantly, the clearance between the baby AT mother board and the closest edge of an expansion board is specified at 0.6 inches. This standard cannot be economically changed.

The "PENTIUM" CPU manufactured by Intel Corporation is a high performance CPU operating at frequencies from 60 to 133 MHz. As a result, the "PENTIUM" dissipates considerable heat. In order to keep the "PENTIUM" within its specified operating range, a heat sink must be mounted on top of the "PENTIUM".

Figure 2:
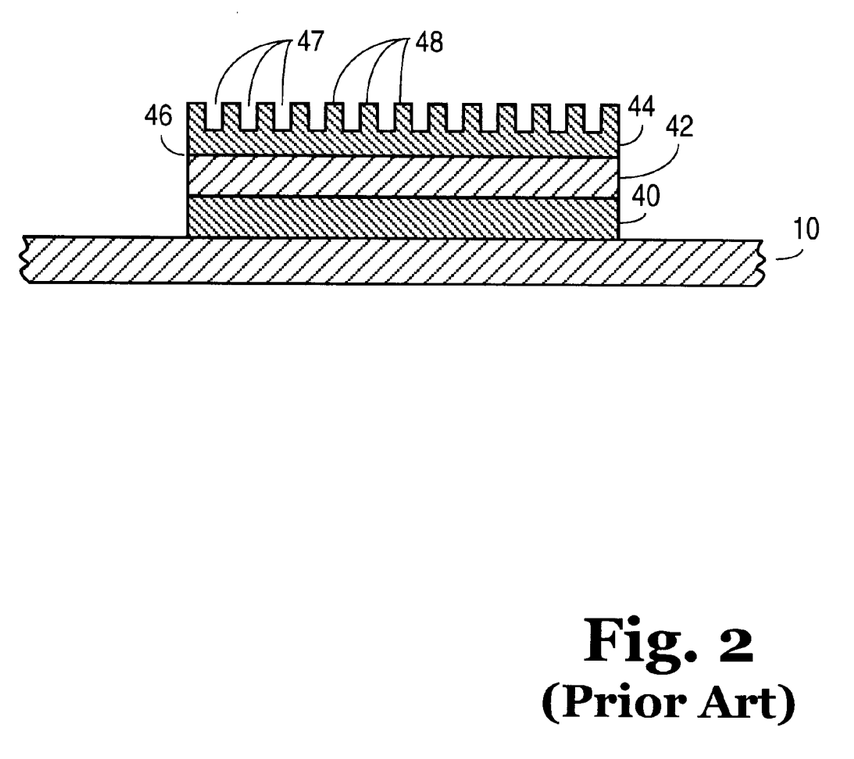
FIG. 2 is a cross-sectional view of the CPU assembly.

FIG. 2 is a cross-sectional view of CPU assembly 18 and mother board 17 of FIG. 1. Referring now to FIG. 2, a socket 40 is mechanically mounted and electrically connected to mother board 17. A packaged "PENTIUM" chip 42 is inserted into socket 40, and a heat sink 44 is mounted to the top of "PENTIUM" chip 42. Heat sink 44 consists of a base portion 46 and a portion in which grooves 47 have been formed so that fins 48 protrude from base portion. The fins are provided to increase the surface area of heat sink 44 and thereby increase its heat dissipation qualities.

An expansion board plugged into connector 21, 25 through can extend the entire length of mother board 10. This is because the components located in area 20 do not exceed the 0.6 inch specification. However, all previous "PENTIUM" heat sinks when combined with the height of socket 40 and "PENTIUM" package 42 exceed the clearance specification between the mother board and the closest edge of an expansion board at 0.6 inches. As a result full length extension boards cannot be used with sockets 22, 23 and 24.

Figure 3A:
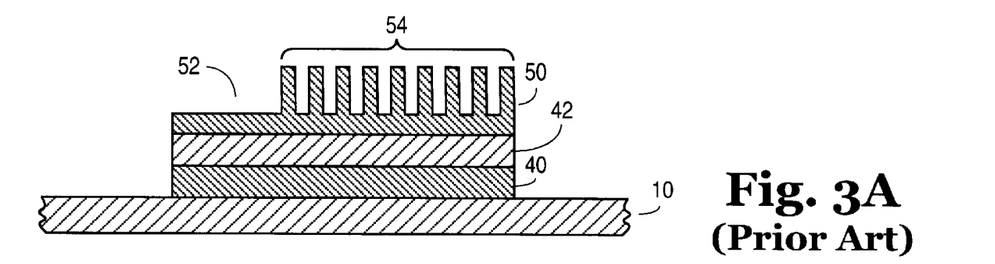
FIGS. 3a, b and c are cross-sectional views of the CPU assembly with various prior art heat sinks.
Figure 3B:
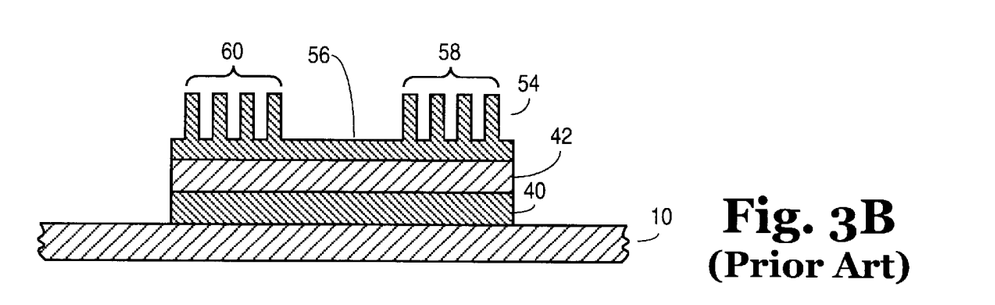
Figure 3C:
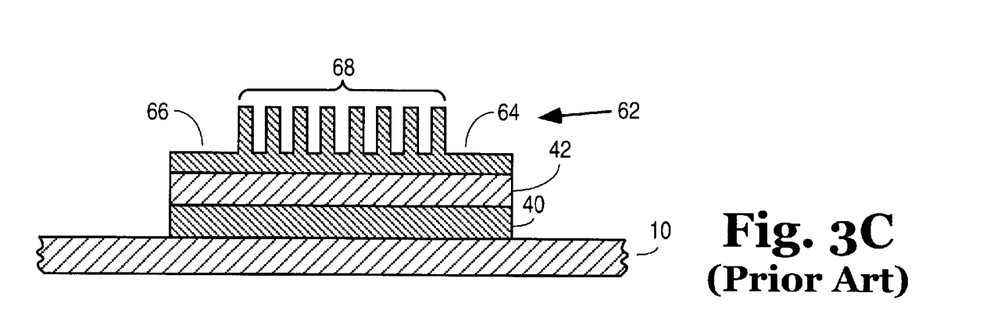

Until recently, this problem was avoided by merely making half length expansion cards. However, the demand for more powerful expansion functions has steadily increased and with it the requirement to use full length expansion boards. To date this need has been met by attempting to add one or more additional full length expansion boards by modifying the heat sink as shown in FIG. 3a, b and c. Referring now to FIG. 3a, heat sink 50 has a portion 52 that is thin and the remaining fin portion 54 which are even higher than the fins in FIG. 2. In this configuration, there is sufficient clearance for one full length expansion board to fit over portion 52. In FIG. 3b, heat sink 54 has a thin portion 56 is in the middle with two fin portions 58 and 60. In FIG. 3c, heat sink 62 thin portions 64 and 66 on either side and a very high finned portion 68 in the middle. With this configuration, two additional full length expansion boards are possible.

All three attempts to make space for additional expansion boards cut away at the horizontal surface area of the fin area and compensated for this loss in surface area by increasing the height of the remaining fins.

While the approaches of the prior art work to provide at least some extra space for expansion boards, they all suffer from the deficiency that not all of the space over the top of the CPU can be used for full length expansion cards, and they provide poor cooling due to air blockage.

SUMMARY OF THE INVENTION

The invention is a heat sink for use on a baby AT mother board that allows all area over a "PENTIUM" CPU to be used for expansion cards. The baby AT mother board includes a CPU socket mounted thereto and into which a "PENTIUM" CPU is plugged. The "PENTIUM" CPU has a predetermined top surface area and is substantially 0.110 inches high. The baby AT mother board further includes a plurality of sockets for expansion boards to be mounted such that the expansion boards when plugged into the expansion board sockets are perpendicular to the baby AT mother board and extend across the top of the "PENTIUM" CPU. The closest point on the expansion board is a specified height above the baby AT mother board. The heat sink comprises heat conductive body having fins formed therein which is mounted on top of the "PENTIUM" and extends beyond the top surface area of the "PENTIUM", but the heat sink in combination with the CPU socket and the "PENTIUM" CPU are less in height than the specified height that the expansion board is above the baby AT mother board.

The invention also includes a heat sink for use with a "PENTIUM-PRO" CPU mounted on a mother board, where the heat sink comprises a conductive body having a substrate portion that makes heat conductive mechanical contact with the "PENTIUM-PRO" CPU. The heat sink also includes a fin portion mechanically attached to the substrate portion. The fin portion has a square wave shaped portion and a horizontal top member attached to the square wave shaped portion to form a plurality of tubular air passages.

BRIEF DESCRIPTION OF THE DRAWING

The preferred embodiment will now be described in connection with the Drawing in which.

DETAILED DESCRIPTION OF THE PREFERRED EMBODIMENT

Figure 4:
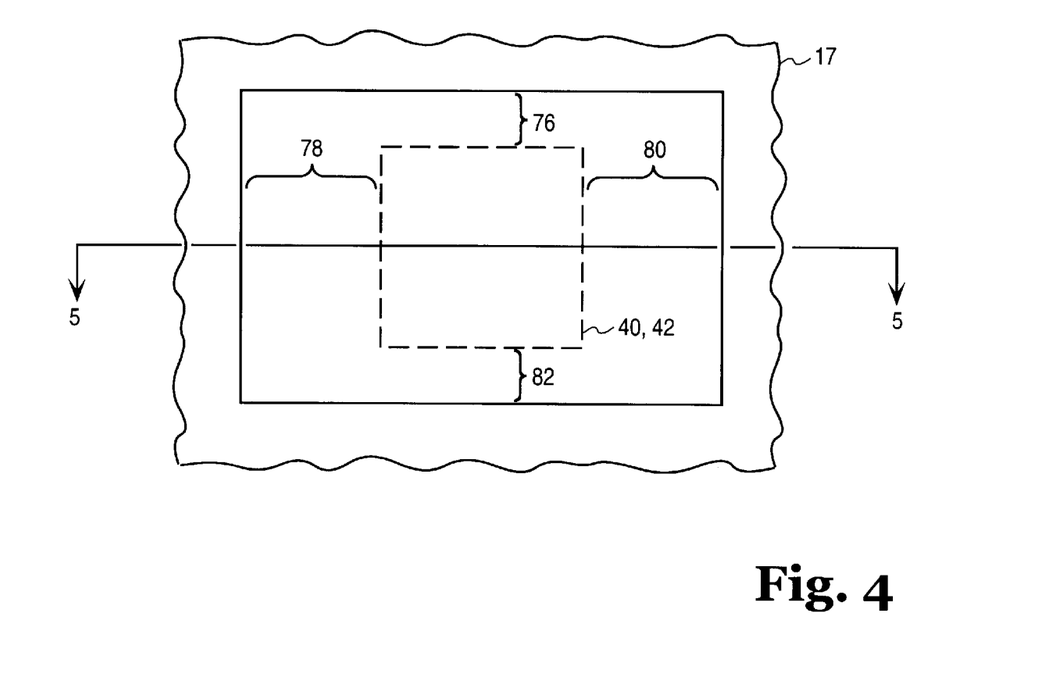
FIG. 4 is a top view of a CPU assembly according to one embodiment of the present invention.
Figure 5:
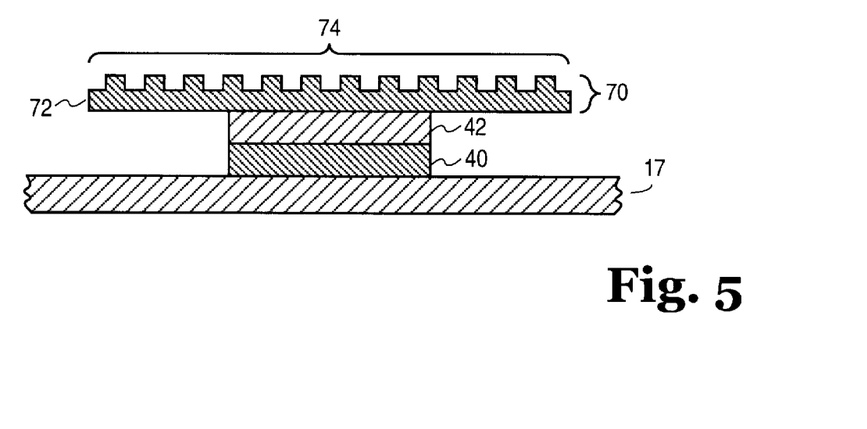
FIG. 5 is a cross sectional view taken through plane A—A of the CPU assembly of FIG. 4.

FIG. 4 is a top view of a CPU assembly according to one embodiment of the present invention, and FIG. 5 is a cross sectional view taken through plane 5—5 of the CPU assembly of FIG. 4. Referring now to FIGS. 4 and 5, socket 40 is manufactured by Foxconn and is no taller than 0.204 inches. CPU chip 42 is a "PENTIUM" and is 0.110 inches thick. Heat sink 70 is mechanically and thermally but not electrically attached to the top of "PENTIUM" chip 42. Heat sink 70 has a base portion 72 which is approximately 0.070 inches thick and a fin portion 74 which is approximately 0.050 inches thick. Unlike prior art heat sinks, heat sink 70 extends beyond the external dimensions of "PENTIUM" 42 in more than one direction. These extensions are shown in FIG. 4 at reference numerals 76 through 82. Also unlike prior art heat sinks used with the "PENTIUM" CPU, heat sink 70 when combined with the thickness of "PENTIUM" 42 and socket 40 is less than 0.6 inches thick. Preferably heat sink 70 is made, typically by extrusion, from a single piece of aluminum or an alloy of copper and aluminum. These two metals have very good heat transfer characteristics and are also inexpensive. Fins 74 are approximately 2.46 inches wide and the interstices between fins 78 are approximately 0.14 in width. The top view dimensions are 2.45 inches by 2.74 inches. This provides a top view surface area of 6.74 inches.

Figure 6:
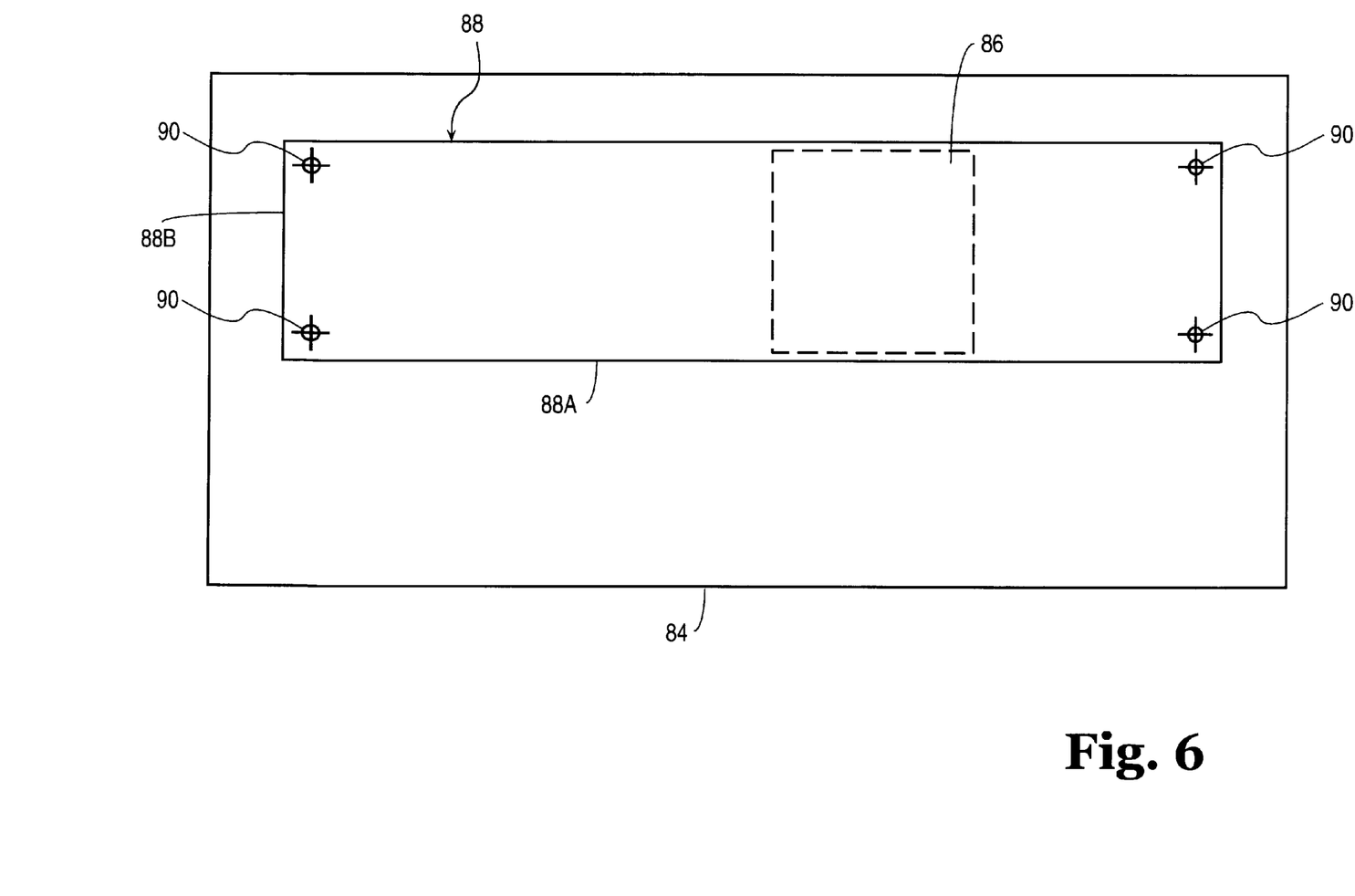
FIG. 6 is a top view of a an alternative mother board.

FIG. 6 shows the setting of another aspect of the present invention. FIG. 6 is a top view of a mother board used for the "PENTIUM PRO", a second CPU manufactured by Intel Corporation, in a multi processing system. Referring now to FIG. 6, a mother board 84 is substantially rectangular in shape. Mother board 84 has a CPU assembly 86 electrically and mechanically attached thereto. On top of CPU assembly 86 is heat sink 88. Heat sink 88 is substantially rectangular in shape with a long dimension 88a and a short dimension 88b. Heat sink 88 is attached to mother board 84 by fasteners 90, typically screws.

Figure 7:
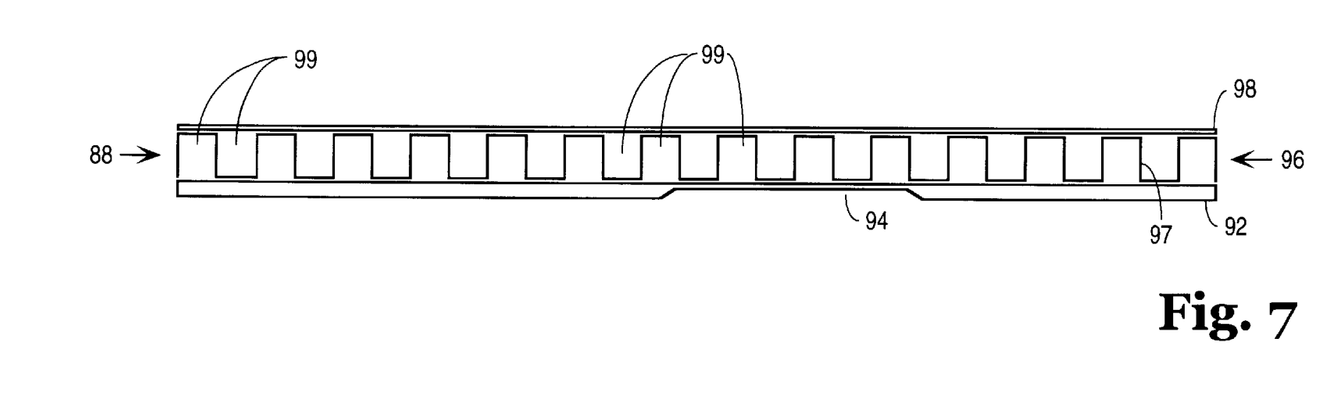
FIG. 7 is a front view of a second embodiment of the heat sink of the present invention.
Figure 8:
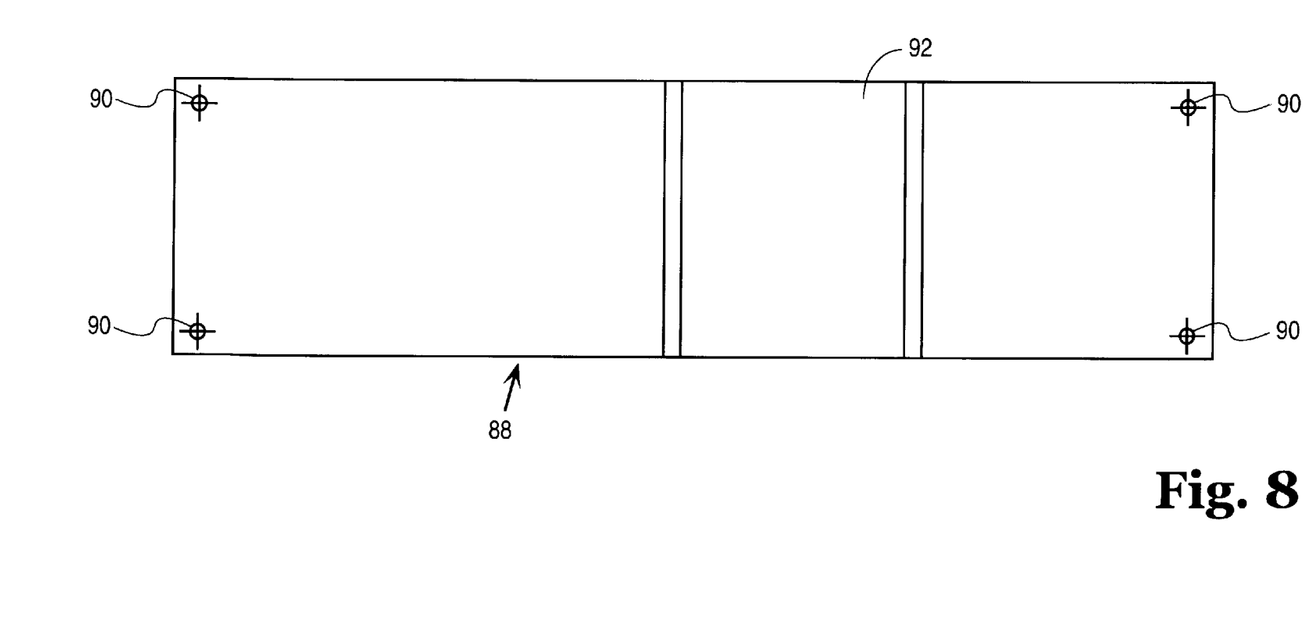
FIG. 8 is a top view of the heat sink of FIG. 7

FIG. 7 is a front view of heat sink 88 and FIG. 8 is a top view of heat sink 88. Referring now to FIGS. 7 and 8, heat sink 88 consists of a substrate member 92 which is approximately 0.135 inches thick. Substrate member 92 has a recess 94 that is approximately 0.015 inches deep. Recess 94 fits on top of CPU housing 86 such that by adding commercially available thermal grease, heat is transferred from CPU 102 to heat sink 88.

A "square wave" shaped member 96 is attached to substrate member 92 such that the channels formed by the vertical sides 97 of square wave member 96 are parallel to the short dimension 88b of heat sink 88. A cover member 98 is attached to square wave member 96 thereby forming passages 99 through which air may pass. Square wave member is approximately 0.22 inches thick and has a 0.38 inch pitch. Cover member 98 would typically be approximately 0.02 inches thick. Substrate member 92, square wave member 96 and top member 98 are made from a heat conductive metal, which is preferably copper that is either anodized or coated with nickel. Attachment of square wave member 96 to substrate member 92 and the attachment of top member 98 to square wave member 96 would typically be done by braising. The entire thickness of heat sink 88 is approximately 0.35 inches.

Figure 9:
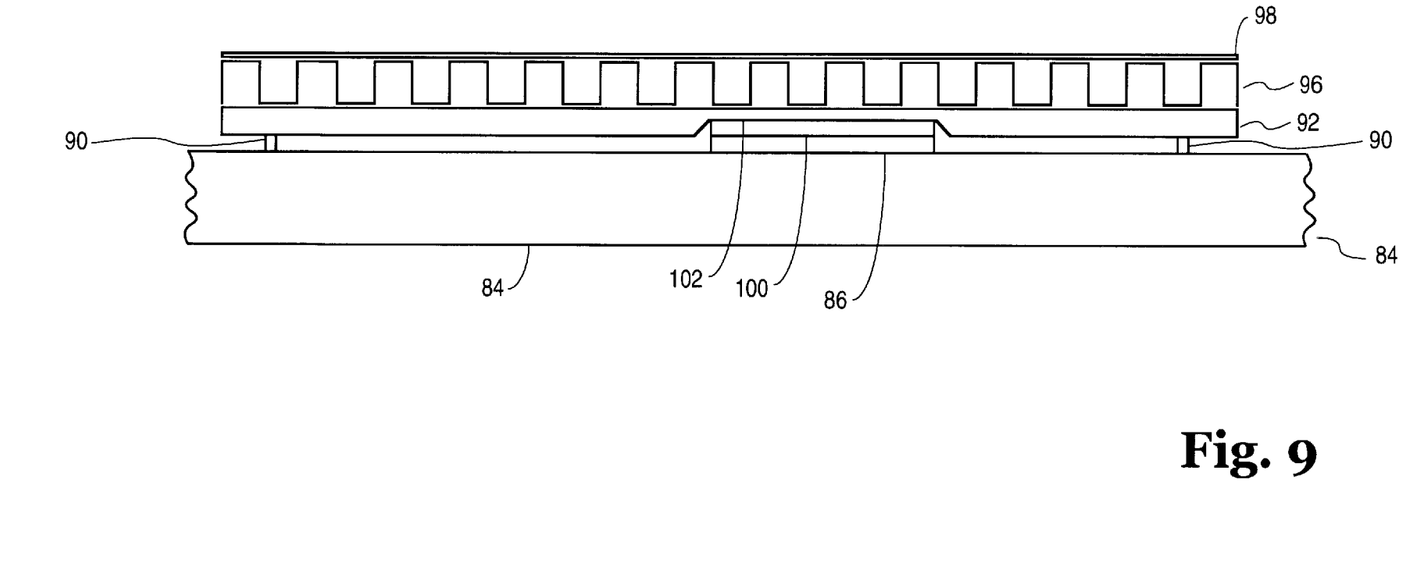
FIG. 9 is a cross sectional view of the heat sink of FIG. 6–8 along with a CPU assembly attached to a mother board.

FIG. 9 is a cross sectional view of a CPU assembly and heat sink attached to a mother board. Referring now to FIG. 9, CPU assembly 86 consisting of a socket 100 and "PENTIUM-PRO" CPU 102 are attached to mother board 84. As can be seen from FIG. 9, CPU 102 fits into recess 94. Heat sink 88 is fastened to mother board 84 by fasteners 90. Fasteners 90 are tightened sufficiently to cause heat sink 88 to apply pressure normal to CPU 102 which compresses the applied thermal grease and makes a complete seal for maximum heat transfer.

Figure 10:
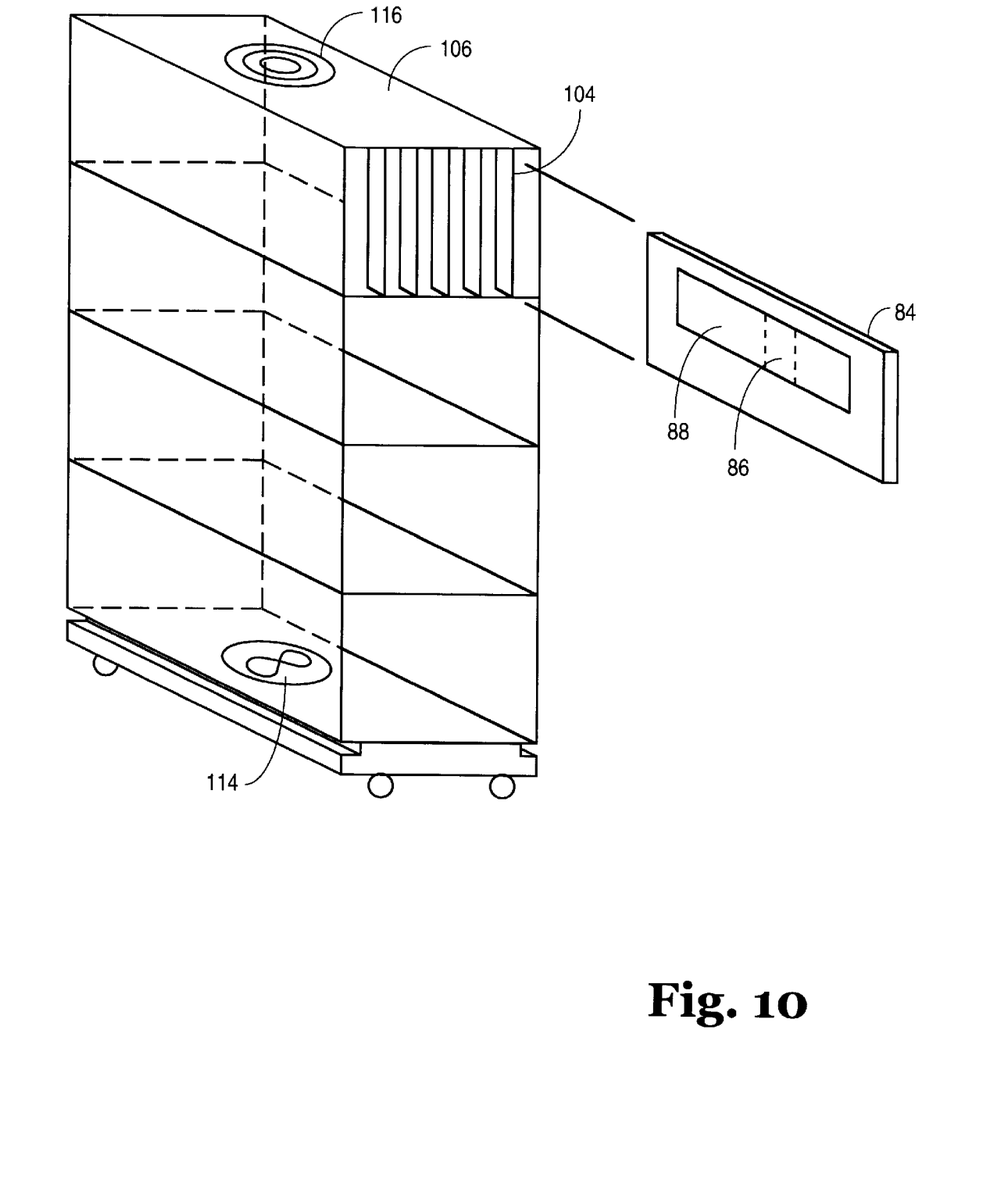
FIG. 10 is a perspective view of mother board with a heat sink according to the present invention in a systems environment.

FIG. 10 is a perspective view of mother board 84 in its systems environment. Referring now to FIG. 10, mother board 84 with heat sink 88 and CPU housing 86 slide into card guides 104 in a card cage 106 such that mother board 84 is in a vertical position. Card cage 106 can accept multiple mother boards, in this case 5. A rack 108 consists of multiple card cages 106, in this case four, stacked vertically. Rack 108 is mounted on a base 110 with casters 112. A blower 114 forces air vertically through rack 108. In this case blower 114 is mounted in the top of rack 108 and air exits through vent 116 in the top of rack 108. In the embodiment with four card cages having four mother boards each, air is passed through rack 108 at the rate of approximately 800 to 1200 cubic feet per minute which provides approximately 80 cubic feet per minute of air over the CPU heat sink.

Since mother board 84 is mounted vertically in card cage 106 tubular passages 99 are also in the vertical. This allows the air which is passing vertically through rack 108 to pass through tubular passages 99 and thereby transfer a maximum amount of heat away from mother board 84.

The foregoing preferred embodiments are subject to numerous adaptations and modifications without departing from the concept of the invention. Therefore, within the scope of the appended claims, the invention may be practiced other than as specifically described herein.

What is claimed is:

1. An apparatus comprising:

a CPU mounted on a mother board;

a conductive body having a substrate portion that makes heat conducting mechanical contact with said CPU; and a fin portion mechanically attached to said substrate portion, said fin portion having a square wave shaped portion and a horizontal top member attached to said square wave shaped portion to form a plurality of tubular air passages.

2. The apparatus of claim 1 wherein said tubular air passages are vertical when in use.

3. The apparatus of claim 1 wherein said substrate portion includes a recess portion into which said CPU fits.

4. The apparatus of claim 1 wherein:

said mother board is rectangular in shape with a long dimension and a short dimension, and said body is substantially rectangular in shape with a long dimension and a short dimension, with said long dimension of said mother board being substantially parallel to said long dimension of said body and with said tubular heat passages being substantially perpendicular to said long dimension of said body.

* * * * *